United States Patent
Broach

(10) Patent No.: US 7,000,128 B1
(45) Date of Patent: Feb. 14, 2006

(54) METHOD AND APPARATUS FOR REDUCING CAPACITIVE LOAD-RELATED POWER LOSS BY GATE CHARGE ADJUSTMENT

(75) Inventor: Michael Eugene Broach, San Mateo, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 571 days.

(21) Appl. No.: 10/334,691

(22) Filed: Dec. 30, 2002

(51) Int. Cl.
*G06F 1/26* (2006.01)

(52) U.S. Cl. .................. 713/320; 713/300; 323/271; 323/275; 323/283; 323/285; 327/108; 327/109

(58) Field of Classification Search ............... 713/300, 713/320; 323/265, 271, 275, 279, 282, 283, 323/285; 327/108, 109
See application file for complete search history.

(56) References Cited

U.S. PATENT DOCUMENTS

| | | | |
|---|---|---|---|
| 5,352,932 A * | 10/1994 | Tihanyi .................... 327/109 |
| 5,973,367 A * | 10/1999 | Williams .................... 257/365 |
| 6,285,173 B1 | 9/2001 | Bentolila et al. .......... 323/282 |
| 6,335,715 B1 | 1/2002 | Lee ............................ 345/87 |
| 6,407,514 B1 | 6/2002 | Glaser et al. ............... 315/247 |
| 6,441,673 B1 | 8/2002 | Zhang ........................ 327/423 |
| 6,778,001 B1 * | 8/2004 | Mayama et al. ........... 327/427 |

* cited by examiner

*Primary Examiner*—Lynne H. Browne
*Assistant Examiner*—Paul Yanchus, III
(74) *Attorney, Agent, or Firm*—Darby & Darby PC; Matthew M. Gaffney

(57) ABSTRACT

The present invention increases power efficiency in power FET applications with varying loads. A constant frequency mode can be used without detracting from efficiency. This is accomplished by reducing repetitive gate charge power losses. The present invention controls the channel impedance of the FET using a timed tri-state driver to drive a level of charge associated with the gate of the FET that is appropriate to the load requirements. When the voltage level at the FET gate reaches the appropriate level, the driver is tri-stated, so that the gate does not continue to charge.

18 Claims, 11 Drawing Sheets

METHOD AND APPARATUS FOR REDUCING CAPACITIVE LOAD-RELATED POWER LOSS BY GATE CHARGE ADJUSTMENT

FIELD OF THE INVENTION

The present invention relates to the field of power FET circuits, and in particular, to a method of reducing capacitive load-related power losses in a circuit by enhancing the charging and discharging of a gate in a power FET device.

BACKGROUND OF THE INVENTION

A conventional power driver circuit is illustrated in FIG. 1. As illustrated in the figure, a driver delivers a gate drive signal to the gate of a field effect transistor (FET). The FET is arranged to drive a load in response to the gate signal.

The driver circuit provides the gate drive signal to the FET in response to a control signal. The gate drive signal corresponds to either the ground potential or the full supply voltage, depending on the control signal. The duty cycle and/or frequency of the gate signal controls the average power that is delivered to the load.

SUMMARY OF THE INVENTION

The invention is related to increasing the power efficiency of a power FET circuit. More specifically, the invention is related to reducing the gate charge power loss in a power FET switching circuit. The invention is related to effectively scaling a power device by adjusting the charge level of the gate of the power device to correspond to load requirements. The invention is related to charging the gate capacitance of a power FET until a load-optimized charge level is reached. Charging and discharging of the FET gate may use less power when the gate capacitance of the power FET is charged until the load-optimized charge level is reached, since the load-optimized charge levels corresponding to some loads are less than the level provided by charging the gate to the full supply voltage. The efficiency thus saved exceeds the efficiency loss caused by the resulting increase in the channel resistance of the power FET when the load-optimized charge level corresponding to the load is less than the level provided by charging the gate to the full supply voltage.

According to one example, a method of scaling a power device circuit by adjusting a charge level of a gate capacitance of the power device circuit comprises initializing a load-optimized charge level. The method further comprises evaluating a pulse control signal when the pulse control signal transitions from one of a first logical level and a second logical level to the other. The first logical level is an inverse of the second logical level. The method further comprises delivering charge to the gate capacitance of the power device circuit when a first condition and a second condition are satisfied. The first condition is satisfied when a level of the pulse control signal corresponds to the first logical level. The second condition is satisfied when the charge associated with the gate capacitance of the power device circuit is less than the load-optimized charge level. The method further comprises removing charge from the gate capacitance of the power device circuit when the level of the pulse control signal corresponds to the second logical level.

According to another example, an apparatus for scaling a power device circuit comprises a driver circuit that includes an output that is coupled to the power device circuit, and a first input that is configured to receive a pulse control signal. The power device circuit is configured to drive a load circuit when the apparatus is active. The driver circuit is arranged to deliver a charge to a gate capacitance that is associated with the power device circuit when the driver circuit is active. The apparatus further comprises a charge level adjustment circuit that includes an output that is coupled to another input of the driver circuit, and a first input that is arranged to receive a command control signal. The amount of charge that is delivered to the gate capacitance is adjusted by the command control signal when the apparatus is active such that a voltage associated with the delivered charge corresponds to a drive voltage for the power device circuit. The drive voltage is in range of a local power supply that is associated with the driver circuit such that the power device circuit is activated by an amount that is approximately optimized for the load circuit.

A more complete appreciation of the present invention and its improvements can be obtained by reference to the accompanying drawings, which are briefly summarized below, to the following detailed description of illustrated embodiments of the invention, and to the appended claims.

DETAILED DESCRIPTION OF THE PREFERRED EMBODIMENT

Figure 1:
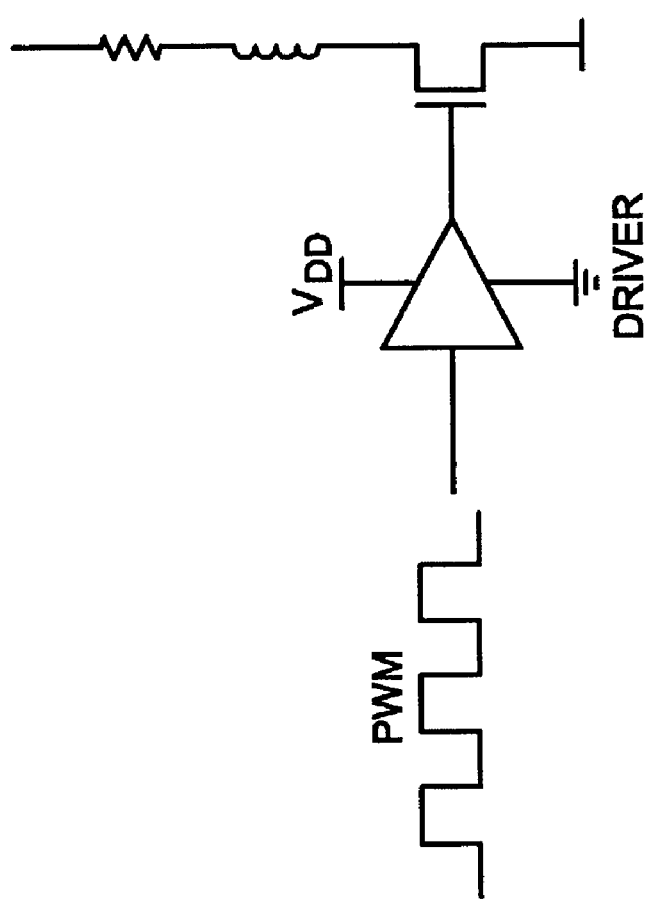
FIG. 1 illustrates a power FET circuit from the background art.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal"

means at least one current, voltage, or data signal. Referring to the drawings, like numbers indicate like parts throughout the views.

The invention is related to virtually scaling a power device by controlling the amount of charge that is applied to the gate of the power device. In one example, the power device is a power FET. The channel impedance of the FET is controlled so that the impedance is limited to load requirements. According to one example, a power device can be driven in constant frequency mode without detracting appreciably from efficiency, in any application in which power FETs are used with varying loads. A few such applications include, but are not limited to: DC/DC converters, motor controllers, and class D amplifiers. The invention can also be used in variable frequency mode.

The invention is related to increasing power efficiency by reducing the amount of charge delivered to the gate of the power device. In power FET applications, power loss results from both gate charge and switch resistance. For light loads, power loss due to gate charge dominates. The invention is related to reducing the amount of charge accumulated at the gate, thereby reducing power dissipation.

In one example, a FET is configured to drive an inductive load. The inductor charges a magnetic field when the FET is active. As the magnetic field charges, the inductor current increases over time. Conversely, when the FET is deactivated, the magnetic field discharges. As the magnetic field discharges, the inductor current decreases over time. The proportion of time that the FET is on controls the proportion of total supply power that is delivered to the load.

Because the gate of the FET has a parasitic capacitance, the voltage associated with the gate of the FET is proportional to the total charge stored at the gate of the FET, according to the equation $V=Q/C$. The driver is configured to deliver current to the gate of the FET while the driver is active. The charge associated with the parasitic gate capacitance of the FET increases over time while the driver delivers current to the gate of the FET. As the charge associated with the parasitic gate capacitance of the FET increases, the voltage associated with the gate of the FET increases. The parasitic gate capacitance of the FET is charged to a load-appropriate charge level, which may correspond to a voltage that is less than the full supply voltage. By charging and discharging of the gate of the FET over a limited operating range, less power is used.

In one example, the driver of the FET gate is tri-stated when the FET gate has charged to the load-appropriate charge level. Since the gate is left floating, no appreciable charge leaves the FET gate, and the FET remains biased active.

Figure 2:
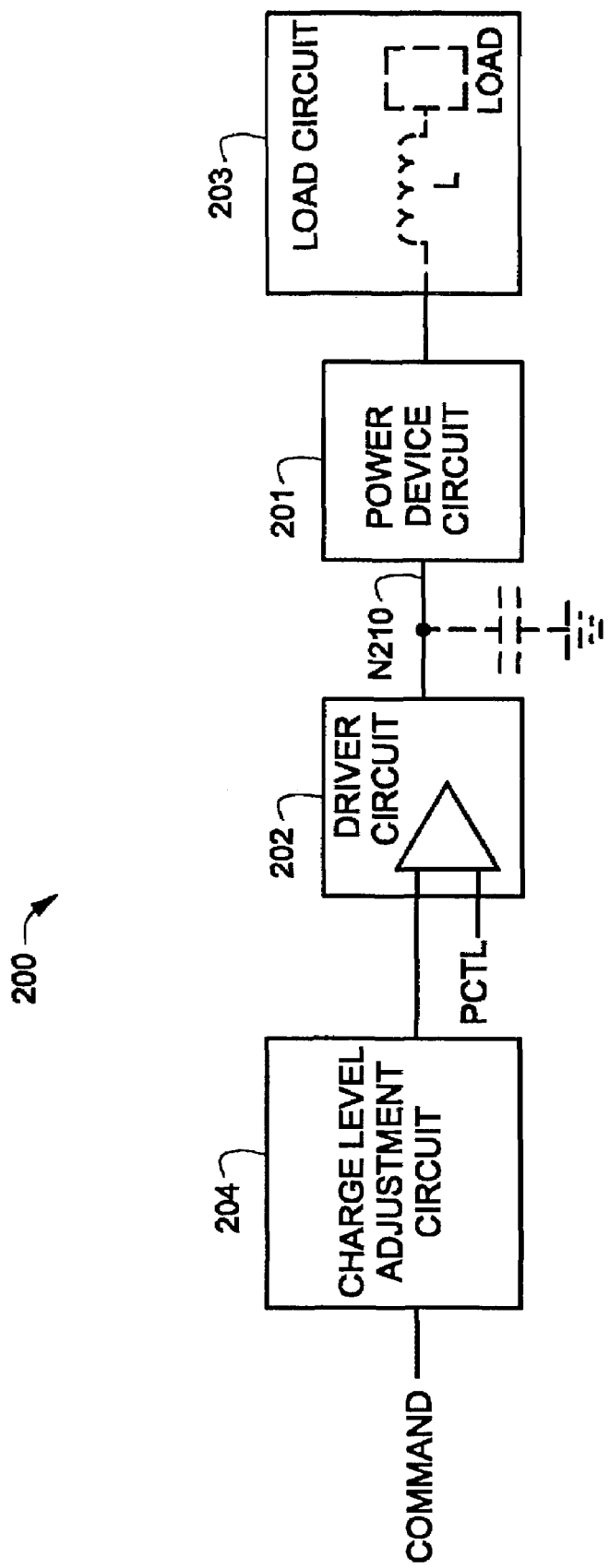
FIG. 2 illustrates a first circuit for scaling a power device circuit.

FIG. 2 illustrates a circuit (200) arranged for scaling a power device. Circuit 200 includes charge level adjustment circuit 204, driver circuit 202, power device circuit 201, and load circuit 203.

Charge level adjustment circuit 204 has an output that is coupled to a first input of driver circuit 202. Driver circuit 202 has an output that is coupled to node N210. Power device circuit 201 has a gate that is coupled to node N210, and an output that is coupled to load circuit 203.

In operation, power device circuit 201 is arranged to drive load circuit 203. Load circuit 203 includes inductor L. The current associated with inductor L increases when power device circuit 201 is active, and decreases when power device circuit 201 is inactive. Circuit 200 is arranged such that the duty cycle of a pulse control logic signal (PCTL) controls the portion of time that power device circuit 201 is active, and the portion of time that power device circuit 201 is active controls the average power that is delivered to the load.

The voltage associated with node N210 controls the channel impedance of power device circuit 201. Node N210 corresponds to the gate of the power device circuit. Since the gate of the power device circuit is a capacitive load, the charge stored at node N210 determines the voltage associated with node N210 ($V=Q/C$).

Charge level adjustment circuit 204 is configured to adjust a charge level that corresponds to a load-optimized charge level for driver circuit 202 to drive load circuit 203. Charge level adjustment circuit 204 receives signal COMMAND, which may be related to a reference voltage.

Driver circuit 202 supplies charge to node N210 while pulse control signal PCTL is active and the total charge stored at node N210 does not exceed the load-optimized charge level set by charge level adjustment circuit 204.

Figure 3:
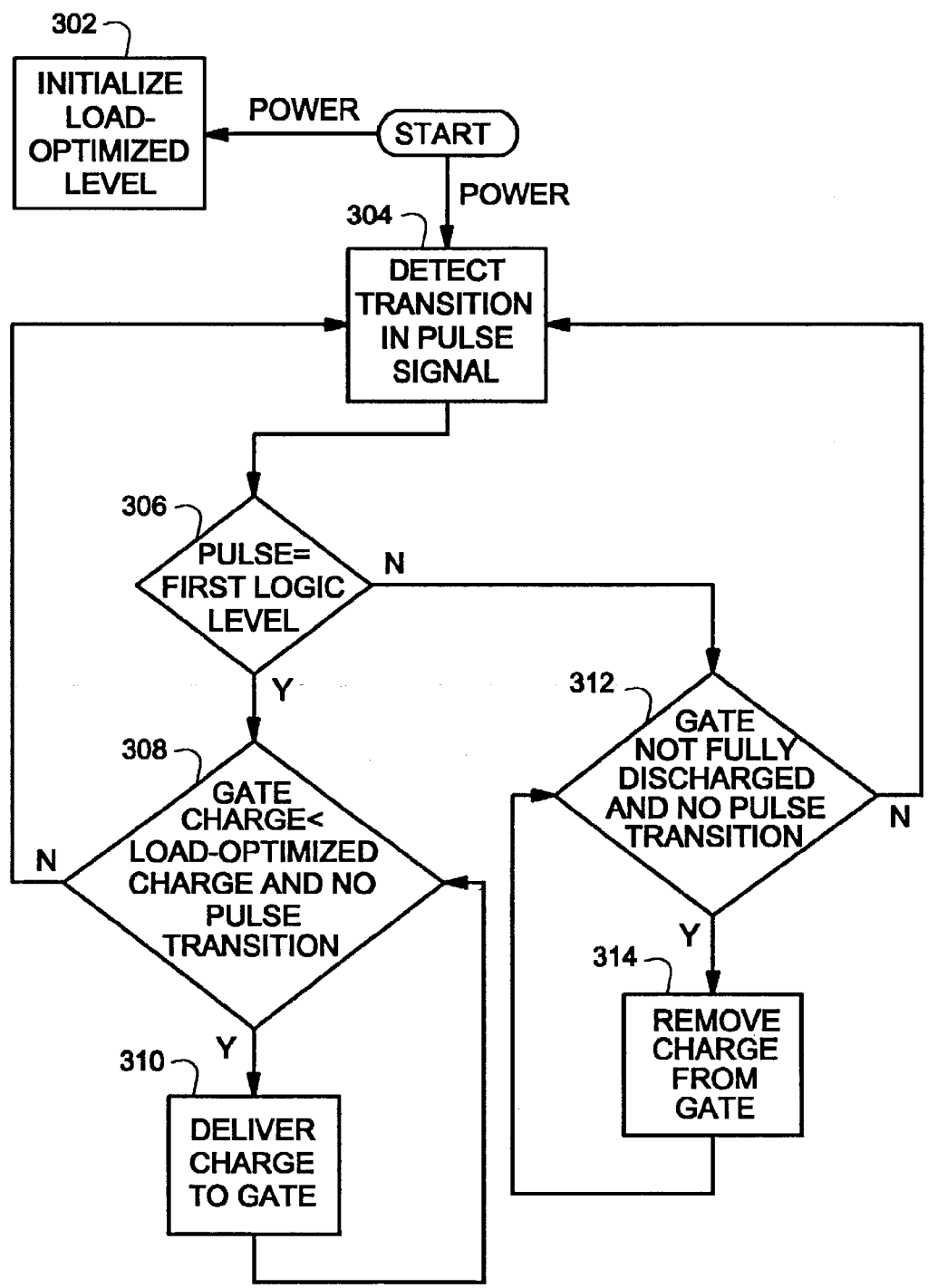
FIG. 3 illustrates a first process for scaling a power device circuit.

Circuit 200 can be better understood with reference to FIG. 3, which illustrates a process for scaling a power device circuit, according to aspects of the invention. The process begins at a start block, and continues to block 302 and block 304 when power is applied.

At block 302, the process initializes a load-optimized charge level. The load-optimized charge level is a reference charge level parameter. The load-optimized charge level is related to the charge level associated with the gate of the power device circuit that will cause the optimal channel impedance (corresponding to the load requirements) at a channel of the power device. Block 302 initializes a reference parameter, and does not actually charge the power device.

At block 304, the process detects the next transition in a pulse control signal (e.g. signal PCTL in FIG. 2). The transition may be a low to high transition or a high to low transition in the pulse control signal. The process proceeds from block 304 to decision block 306. At decision block 306, the process evaluates the logical level of the pulse control signal. The process proceeds from decision block 306 to decision block 308 when the pulse control signal is at a first logical level. Alternatively, the process proceeds from decision block 306 to decision block 312 when the pulse control signal is at a second logical level. The second logical level is an inverse of the first logical level.

At decision block 308, the process compares the total charge associated with the gate of the power device to the load-optimized charge level, and evaluates whether a transition in the pulse control signal has occurred. The process continues at block 310 when the gate charge is less than the load-optimized charge level and no transition has occurred in the pulse control signal. Alternatively, the process continues at block 304 when the gate charge is not less than the load-optimized charge level or a transition in the pulse control signal has occurred.

At block 310, charge is delivered to the gate of the power device. In one embodiment, the power device includes a FET that has a parasitic capacitance associated with the gate. The voltage associated with the gate of the power device will increase as charge is accumulated by the parasitic capacitance. The process proceeds from block 310 to decision block 308.

At decision block 312, the process evaluates whether the gate of the power device is fully discharged, and whether a transition in the pulse control signal has occurred. The process proceeds from decision block 312 to block 304 when the gate of the power device is fully discharged or a transition in the pulse control signal has occurred. Alternatively, the process proceeds from decision block 312 to block 314 when the gate of the power device is not fully discharged and a transition in the pulse control signal has not occurred. At block 314, the process removes charge from the gate of the power device. The process continues from block 314 to decision block 312.

In one example, when the pulse control signal transitions to the second logic level, a switch will close, discharging the gate to ground immediately, and the process will continue at block 304 after the gate has been fully discharged. In another example, the gate will discharge to a second load-optimized charge level rather than discharging to ground. For example, the process may be used for a motor control application in which the motor is configured to run at two different speeds or loads. One load-optimized charge level corresponds to one speed or load of the motor, and the other load-optimized charge level corresponds to the other speed or load of the motor.

The process illustrated by FIG. 3 will prevent the total charge stored at the gate of the power device circuit from exceeding the load-optimized charge level. The amount of charge associated with the gate of the power device circuit controls the channel impedance of the power device. The channel impedance should be sufficient to support the load, but should not waste power. Charging is terminated by decision block 308 when the charge associated with the gate of the power device reaches the load-optimized charge level. The voltage associated with FET gate is limited by limiting the total charge delivered to the gate.

The process shown in FIG. 3 is arranged to virtually scale the power device for requirements of the load by controlling the total charge level of the gate of the power device. The gate of the power device stops charging when the charge level associated with the gate of the device reaches the load-optimized charge level. Since the gate is a capacitive load, the voltage associated with the gate of the device will not increase when the gate stops charging. By charging and discharging of the gate of the FET over a limited operating range, less power is used.

Figure 4:
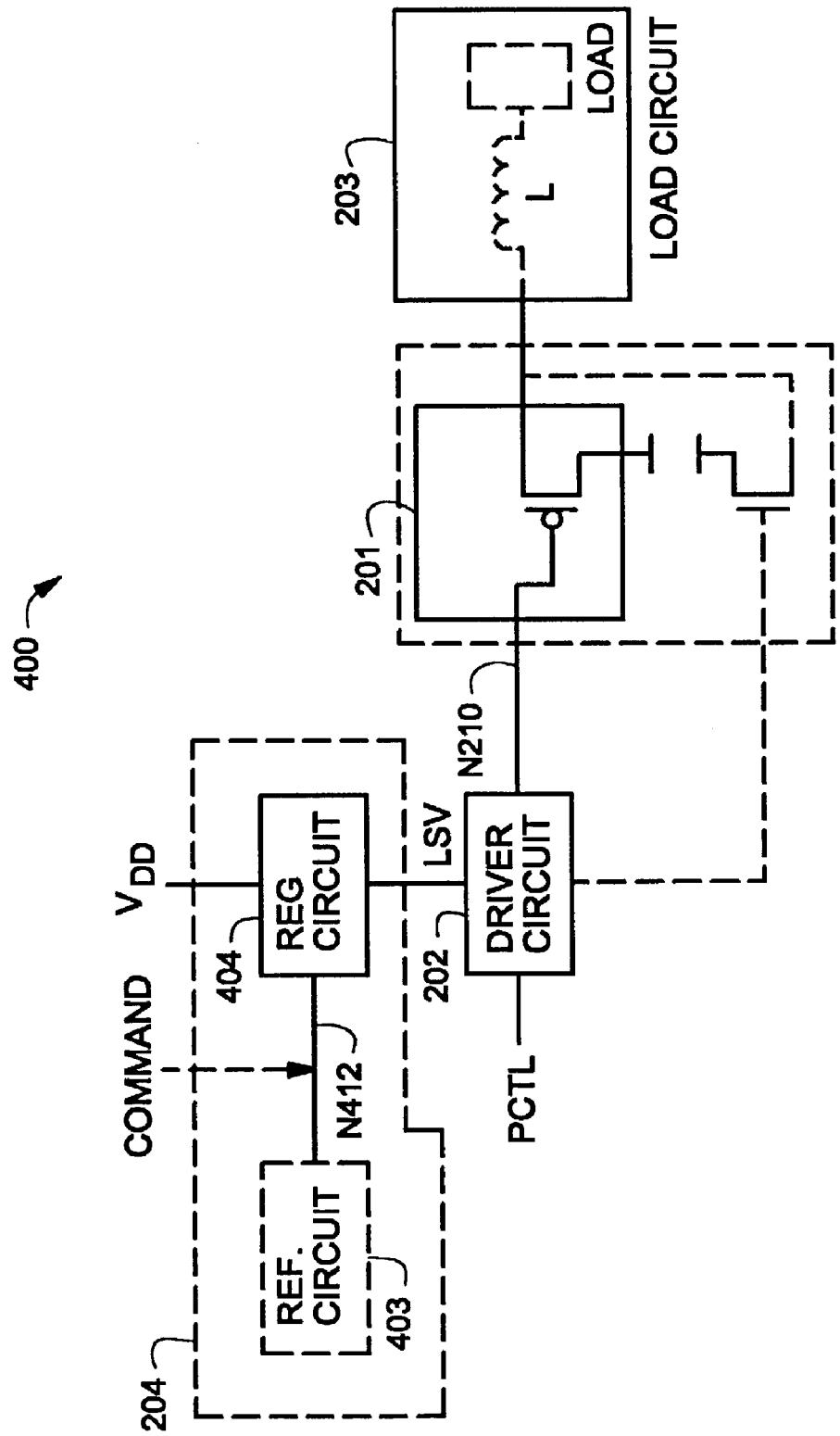
FIG. 4 illustrates a second circuit for scaling a power device circuit.

FIG. 4 illustrates a circuit (400) for scaling a power device. Circuit 400 is substantially similar to circuit 200. However, a detailed example of charge level adjustment circuit 204 is further described below. Like numbers indicate like parts throughout the figures. Charge level adjustment circuit 204 includes regulator circuit 404, and optionally includes reference circuit 403.

Regulator circuit 404 has an input that is coupled to node N412, and an output that is coupled to an input of driver circuit 202. Optionally, reference circuit 403 is coupled to node N412. Optionally, power device circuit 201 includes one or more FETs.

Charge level adjustment circuit 204 is arranged to adjust the output level of driver circuit 202 by linearly pre-regulating the local supply voltage (LSV) of driver circuit 202. Charge level adjustment circuit 204 initializes a reference voltage related to the signal at node N412. In one example, the signal at node N412 is the command control signal (COMMAND). In another example, the signal at N412 is the output of reference circuit 403. The reference voltage is compared to a voltage associated with a sensed signal that is related to the local supply voltage (LSV). The local supply voltage (LSV) is increased when the voltage associated with the sensed signal is less than the reference voltage. Conversely, the local supply voltage (LSV) is decreased when the voltage associated with the sensed signal is greater then the reference voltage.

Charge level adjustment circuit 204 regulates the local supply voltage (LSV) of driver circuit 202. By regulating the local supply voltage (LSV) of driver circuit 202, charge level adjustment circuit 204 controls the charge level at node N210.

Figure 5:
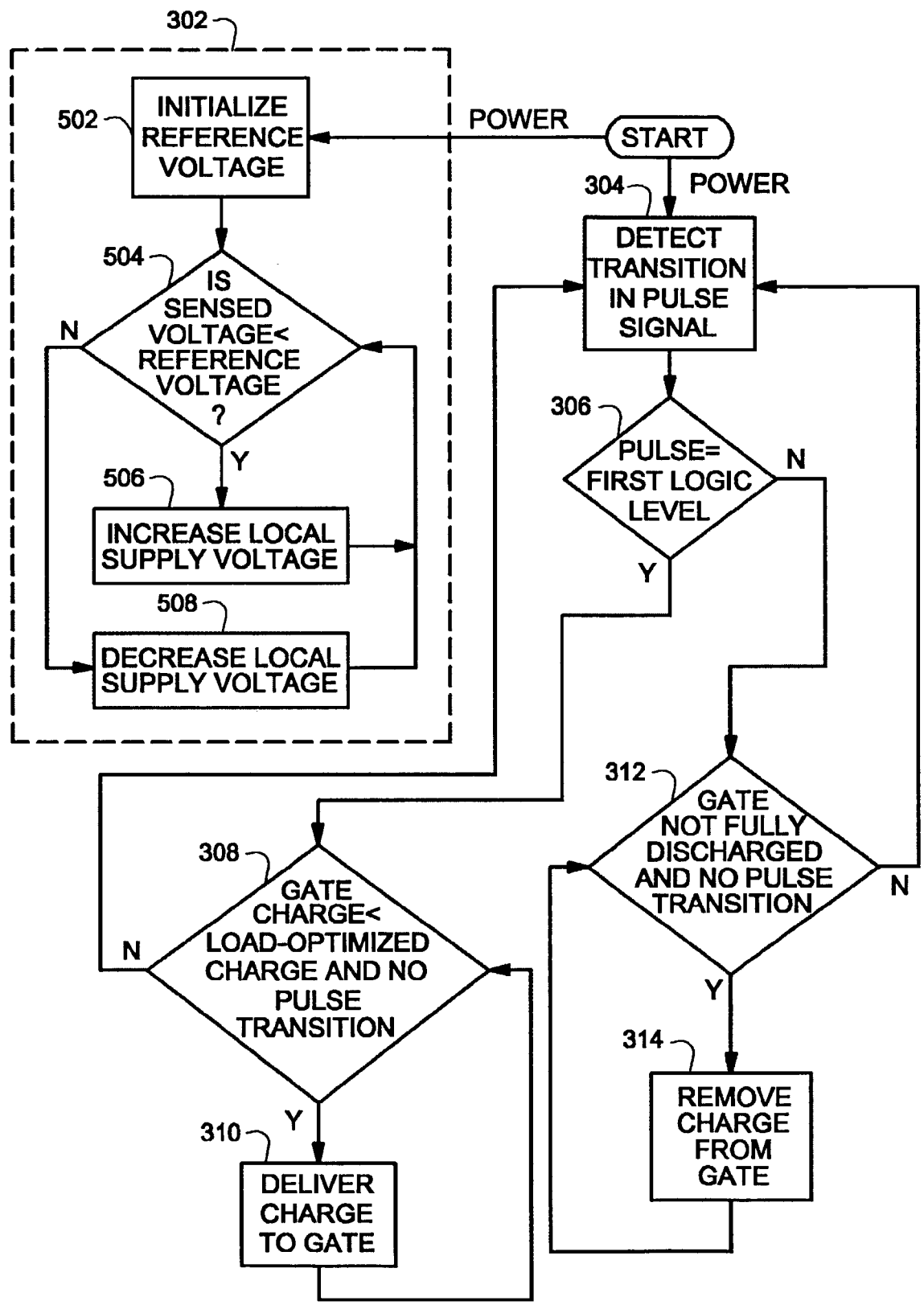
FIG. 5 illustrates a second process for scaling a power device circuit.

Circuit 400 can be better understood with reference to FIG. 5, which illustrates a process for scaling a power device circuit, according to aspects of the invention. The process illustrated in FIG. 5 is substantially similar to the process illustrated in FIG. 3. However, a detailed example of block 302 is further described below. Like numbers indicate like parts throughout the figures.

The process proceeds from a start block to block 304 and block 502 when power is applied. At block 502, the process initializes a reference voltage. The reference voltage corresponds to the load-optimized charge level. From block 502, the process proceeds to decision block 504. At decision block 504, the process compares the voltage associated with the sensed signal to the reference voltage. The voltage associated with the sensed signal is related to the local supply voltage. The process proceeds from decision block 504 to block 506 when the voltage associated with the sensed signal is less then the reference voltage. At block 506, the process increases the local supply voltage. The process proceeds from block 506 to decision block 504. The process proceeds from decision block 504 to block 508 when the voltage associated with the sensed signal is greater than the reference voltage. At block 508, the process decreases the local supply voltage. The process proceeds from block 508 decision block 504.

The process illustrated in FIG. 5 is one example of the general process illustrated in FIG. 3. In the process illustrated in FIG. 5, the power device gate voltage is controlled by linearly preregulating the local supply voltage of the driver circuit.

Figure 6:
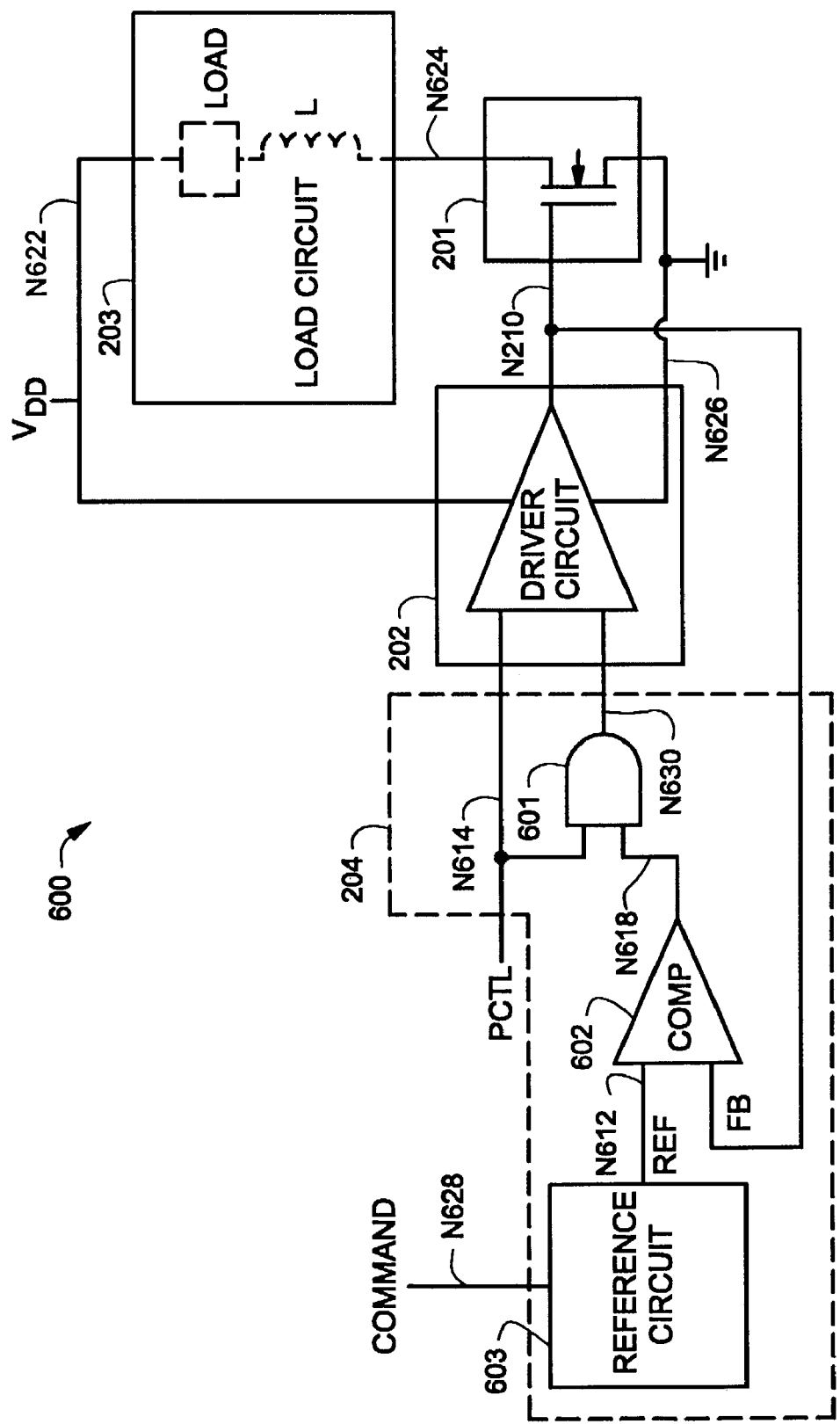
FIG. 6 illustrates a third circuit for scaling a power device circuit.

FIG. 6 illustrates a circuit (600) for scaling a power device. Circuit 600 is substantially similar to circuit 200. However, an embodiment of charge level adjustment circuit 204 is detailed below. Like numbers indicate like parts throughout the figures.

Charge level adjustment circuit 204 includes reference circuit 603, comparator circuit 602, and AND gate 601. Reference circuit 603 has an input that is coupled to node N628 and an output that is coupled to node N612. Comparator circuit 602 has a first input that is coupled to node N612, a second input that is coupled to node N210, and an output that is coupled to node N618. AND gate 601 has a first input that is coupled to node N614, a second input that is coupled to node N618, and an output that is coupled to node N630. Driver circuit 202 has a first input that is coupled to node N614, a second input that is coupled to node N630, and an output that is coupled to node N210. Power device circuit 201 has a gate that is coupled to node N210, a source that is coupled to node N626, and a drain that is coupled to node N624. Load circuit 203 is coupled between node N622 and node N624.

In operation, a command control signal (COMMAND) is applied to node N628, a pulse control signal (PCTL) is applied to node N614, a power signal is applied to node N622, and a ground signal is applied to node N626. Reference circuit 603 provides a reference signal (REF) to node N612 that corresponds to a particular charge level. Comparator circuit 602 is configured to provide a signal to node N618 in response to a comparison between the reference signal (REF) and a feedback signal (FB) from node N210.

The reference circuit (603) produces the reference signal (REF) in response to the command control signal (COM- MAND). Driver circuit 202 is configured for selective activation and deactivation in response to the pulse control signal (PCTL). AND gate 601 combines PCTL and the output of the comparator circuit (602) such that the driver circuit (202) is tri-stated when the feedback signal (FB) exceeds the reference signal (REF) and the pulse control signal (PCTL) is active.

The parasitic capacitance that is associated with node N210 is dominated by the gate capacitance (or capacitances) of the power device circuit (201). After the total charge accumulated on node N210 reaches the desired charge level, the driver circuit (202) is tri-stated such that no additional charge is accumulated on node N210. Since node N210 is essentially floating when the driver circuit (202) is tri-stated, no appreciable charge is lost from node N210 and the power device circuit (201) continues driving the load.

Figure 7:
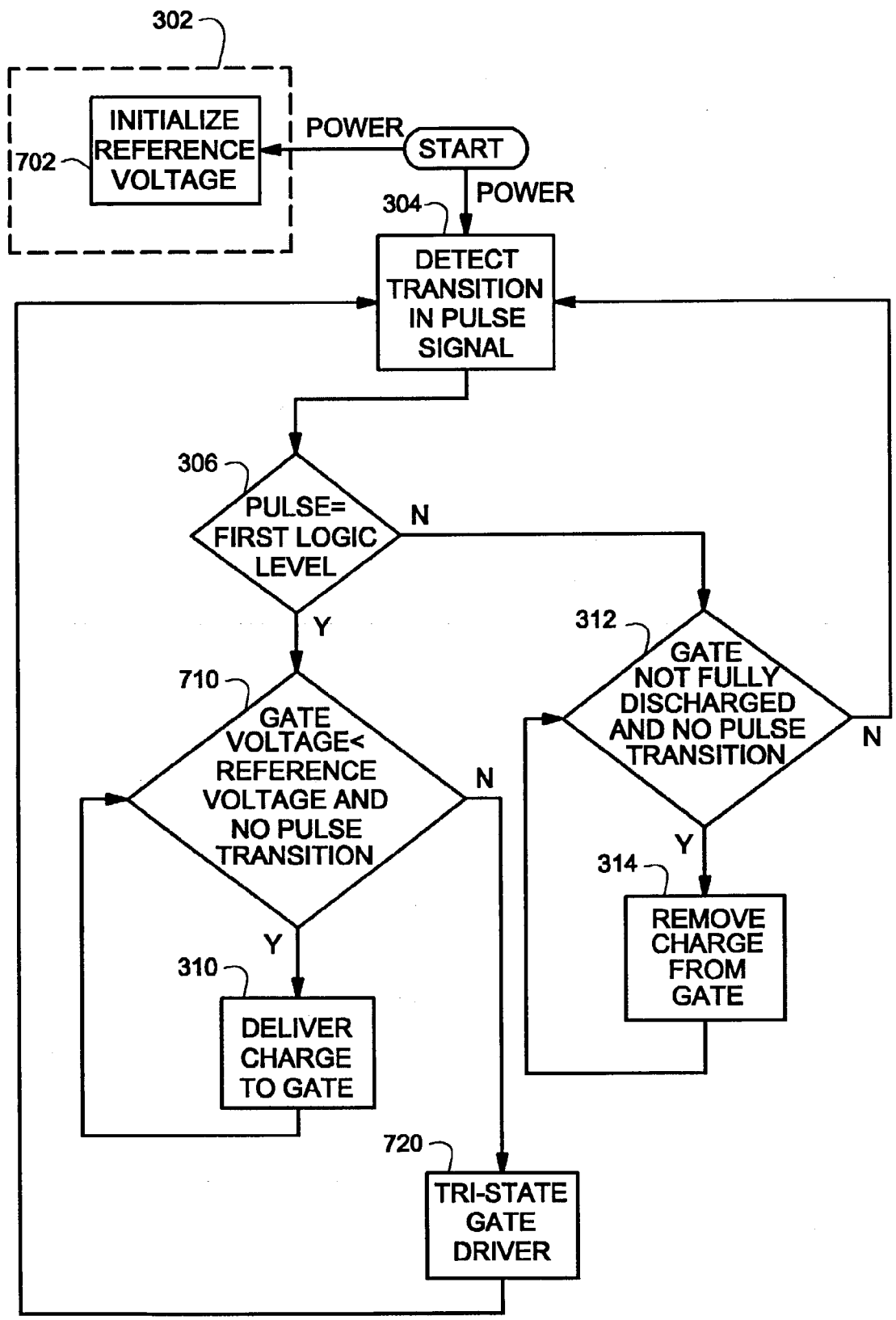
FIG. 7 illustrates a third process for scaling a power device circuit.

Circuit 600 can be better understood with reference to FIG. 7. FIG. 7 illustrates a process for scaling a power device circuit, according to aspects of the invention. The flow proceeds from a start block to block 702 and block 304 when power is applied. At block 702, the process initializes a reference voltage. The reference voltage is related to the load-optimized charge level. At block 304, the process detects the next transition in the pulse control signal. The transition may be a positive transition or a negative transition. The process then proceeds from block 304 to decision block 306. At decision block 306, the process evaluates the logical level of the pulse control signal. The process proceeds from decision block 306 to decision block 710 when the pulse control signal is at a first logical level. The process proceeds from decision block 306 to decision block 312 when the pulse control signal is at a second logical level. The second logical level is an inverse of the first logical level.

At decision block 710, the process compares a sensed gate voltage to the reference voltage, and evaluates whether a transition has occurred in the pulse control signal. The sensed gate voltage is related to the voltage associated with the gate of the power device circuit. The process moves from decision block 710 to block 310 when the sensed gate voltage is less than the reference voltage and no transition has occurred in the pulse control signal. Alternatively, the process moves from decision block 710 to block 720 when the sensed gate voltage does not exceed the reference voltage or a transition in the pulse control signal has occurred. At block 720, the process tri-states the driver of the power device. The process then proceeds from block 720 to block 304. At block 310, charge is delivered to the gate of the power device. In one embodiment, the power device includes a FET that has a parasitic capacitance associated with the gate. The voltage associated with the gate of the power device will increase as charge is accumulated by the parasitic capacitance. The process proceeds from block 310 to decision block 710.

At decision block 312, the process evaluates whether the gate of the power device is fully discharged, and whether a transition in the pulse control signal has occurred. The process proceeds from decision block 312 to block 304 when the gate of the power device is fully discharged or a transition in the pulse control signal has occurred. Alternatively, the process proceeds from decision block 312 to block 314 when the gate of the power device is not fully discharged and a transition in the pulse control signal has not occurred. At block 314, the process removes charge from the gate of the power device. The process continues from block 314 to decision block 312.

In the process shown in FIG. 7, the gate of the power device floats when the sensed gate voltage of the power device reaches a reference voltage. Power is conserved by not allowing the gate of the power device to continue charging once the sensed gate voltage reaches the reference voltage.

Figure 8:
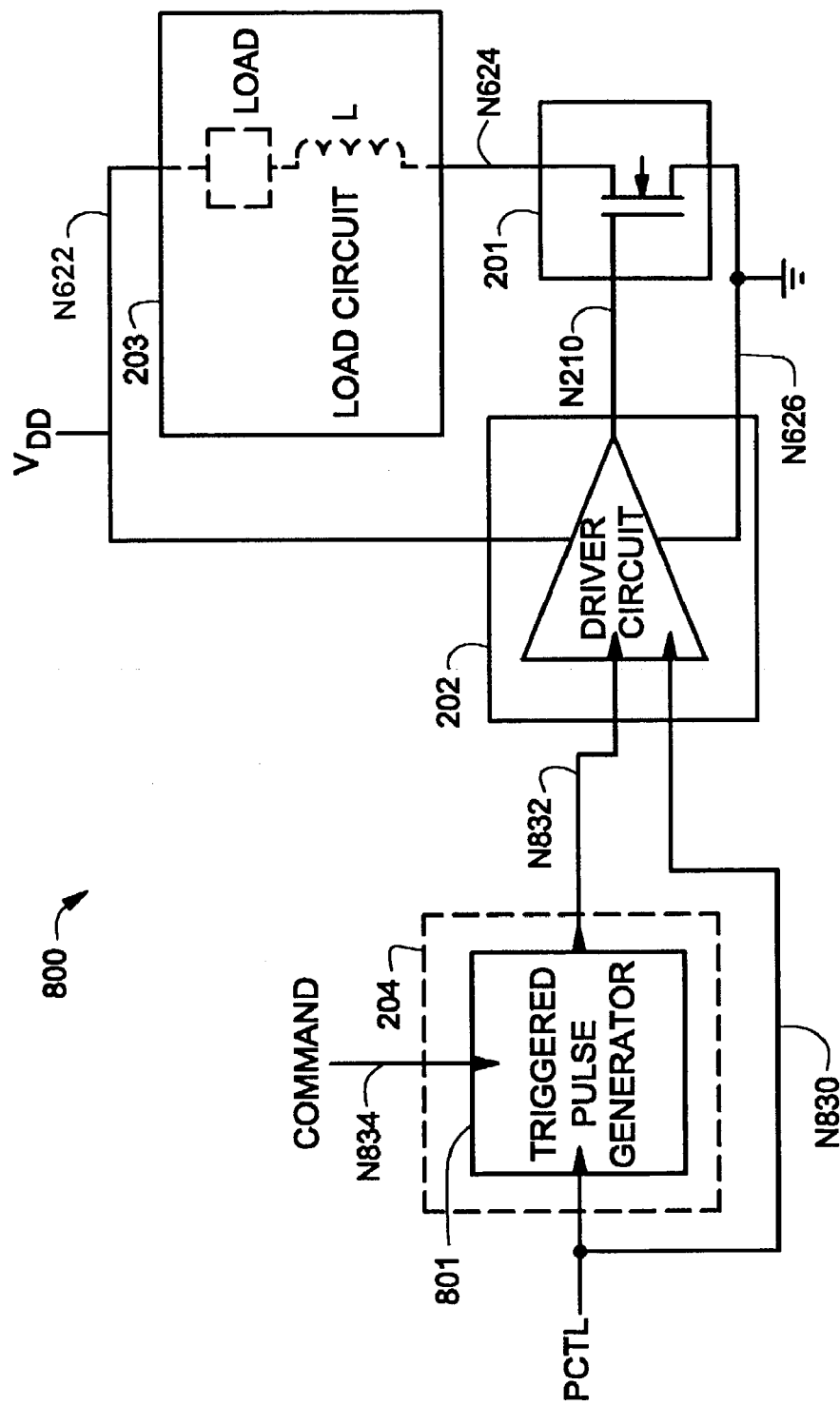
FIG. 8 illustrates a fourth circuit for scaling a power device circuit.

FIG. 8 illustrates a circuit (800) for scaling a power device. Circuit 800 is substantially similar to circuit 200. However, a detailed example of charge level adjustment circuit 204 is further described below. Like numbers indicate like parts throughout the figures. Charge level adjustment circuit 204 includes triggered pulse generator 801.

Triggered pulse generator 801 has a first input that is coupled to node N830, a second input that is coupled to node N834, and an output that is coupled to node N832. Driver circuit 202 has a first input that is coupled to node N832, a second input that is coupled to node N830, a third input that is coupled to node N622, a fourth input that is coupled to node N626, and an output that is coupled to node N210. Power device circuit 201 has a gate that is coupled to node N210, a drain that is coupled to node N624, and a source that is coupled to node N626. Load circuit 203 is coupled between node N622 and node N624.

In operation, a command control signal (COMMAND) is applied to node N834, a pulse control signal (PCTL) is applied to node N830, a power signal is applied to node N622, and a ground signal is applied to node N626. The triggered pulse generator (801) is configured to provide a pulse signal to node N832 when activated in response to a transition in the pulse control signal (PCTL). The triggered pulse generator is arranged such that the length of the pulse is controlled by the command control signal (COMMAND). Driver circuit 202 is configured such that driver circuit 202 is activated in response to the pulse signal, tri-stated at the end of the pulse signal, and deactivated when the pulse control signal (PCTL) transitions to an opposite logic level.

The parasitic capacitance that is associated with node N210 is dominated by the gate capacitance (or capacitances) of the power device circuit (201). Driver circuit 202 is arranged to deliver charge to node N210 when the pulse signal is active. The pulse signal has an adjustable width that is controlled by the command control signal (COMMAND). By activating the driver circuit for a predetermined time interval (as determined by the pulse width), the total charge that is accumulated on node N210 is limited such that the power device circuit (201) is activated for a specified load condition. The driver circuit (202) is tri-stated on the trailing edge of the pulse signal such that virtually no additional charge is accumulated on node N210. Since node N210 is essentially floating when the driver circuit (202) is tri-stated, no appreciable charge is lost from node N210 and the power device circuit (201) will continue driving the load.

Figure 9:
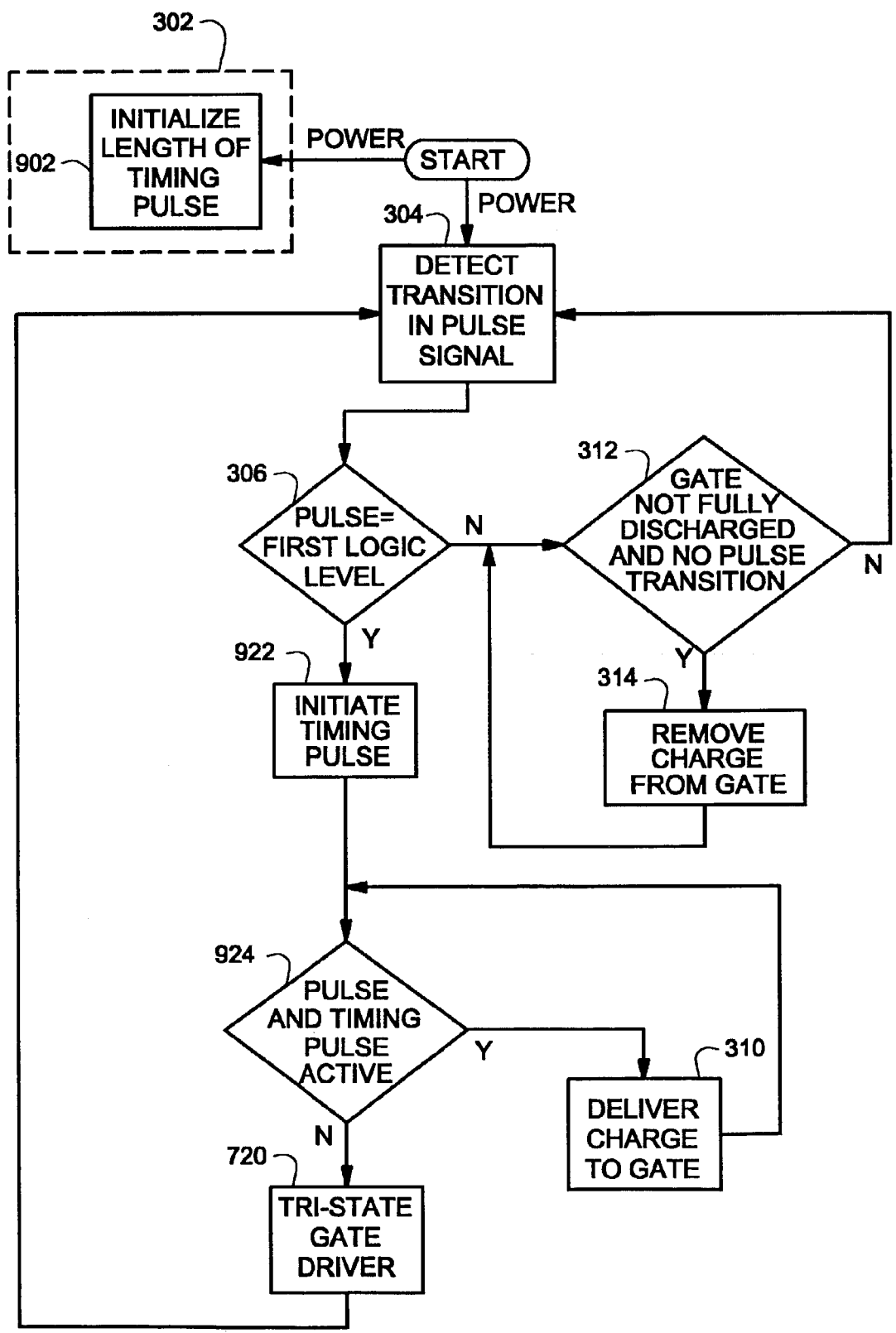
FIG. 9 illustrates a fourth process for scaling a power device circuit.

Circuit 800 can be better understood with reference to FIG. 9. FIG. 9 illustrates a process for scaling a power device circuit, according to aspects of the invention. Processing proceeds from the start block to block 902 and block 304 when power is applied. At block 902, the process initializes the length of the timing pulse. The length of the timing pulse corresponds to the load-optimized charge level. The timing pulse is not initiated at block 902; rather, a parameter corresponding to the length of the timing pulse is initialized. At block 304, the process detects the next transition in a pulse control signal (e.g., PCTL). The transition may be a positive transition or a negative transition. The process proceeds from block 304 to decision block 306. At decision block 306, the process evaluates the logical level of the pulse control signal. The process proceeds from decision block 306 to block 922 when the pulse control signal is at a first logical level. The process proceeds from block 306 to decision block 312 when the pulse control signal is at a second logical level. The first logical level is an inverse of the second logical level.

At block 922, the process initiates a timing pulse. The logic proceeds from block 922 to decision block 924. Decision block 924 evaluates whether the pulse control signal and the timing pulse are both active. The process proceeds from decision block 924 to block 310 when the pulse control signal and the timing pulse are both active. The process proceeds from decision block 924 to block 720 when the pulse control signal and the timing pulse are not both active. At block 720, the process tri-states the driver of the gate. The process then proceeds from block 720 to block 304.

At block 310, charge is delivered to the gate of the power device. In one embodiment, the power device includes a FET that has a parasitic capacitance associated with the gate. The voltage associated with the gate of the power device will increase as charge is accumulated by the parasitic capacitance. The process then proceeds from block 310 to decision block 924.

At decision block 312, the process evaluates whether the gate of the power device is fully discharged, and whether a transition in the pulse control signal has occurred. The process proceeds from decision block 312 to block 304 when the gate of the power device is fully discharged or a transition in the pulse control signal has occurred. Alternatively, the process proceeds from decision block 312 to block 314 when the gate of the power device is not fully discharged and a transition in the pulse control signal has not occurred. At block 314, the process removes charge from the gate of the power device. The process continues from block 314 to decision block 312.

In one example, when the pulse control signal transitions to the second logic level, a switch will close, discharging the gate to ground immediately, and the process will continue at block 304 after the gate has been fully discharged. In another example, the gate will discharge to a second load-optimized charge level rather than discharging to ground. For example, the process may be used for a motor control application in which the motor is configured to run at two different speeds. One load-optimized charge level corresponds to one speed of the motor, and the other load-optimized charge level corresponds to the other speed of the motor.

When the pulse control signal transitions to the first logical level, a timing pulse is initiated, and the parasitic gate capacitance of the power device begins charging. At the end of the timing pulse, the power device gate is left floating. The power device gate remains floating until the pulse control signal transitions to the second logic level. The parasitic gate capacitance of the power device begins discharging when the pulse control signal reaches the second logic level.

The pulse control signal adjusts the power delivered to the load by adjusting the charge level that is accumulated on the parasitic gate capacitance of the power device. However, the driver circuit is configured to tri-state at the end of the timing pulse, before the pulse signal is completed. Power is conserved by tri-stating the driver circuit before the pulse signal is completed. The timing pulse has duration such that the end of timing pulse will occur when the parasitic gate capacitance has been charged to the load-optimized charge level.

Figure 10:
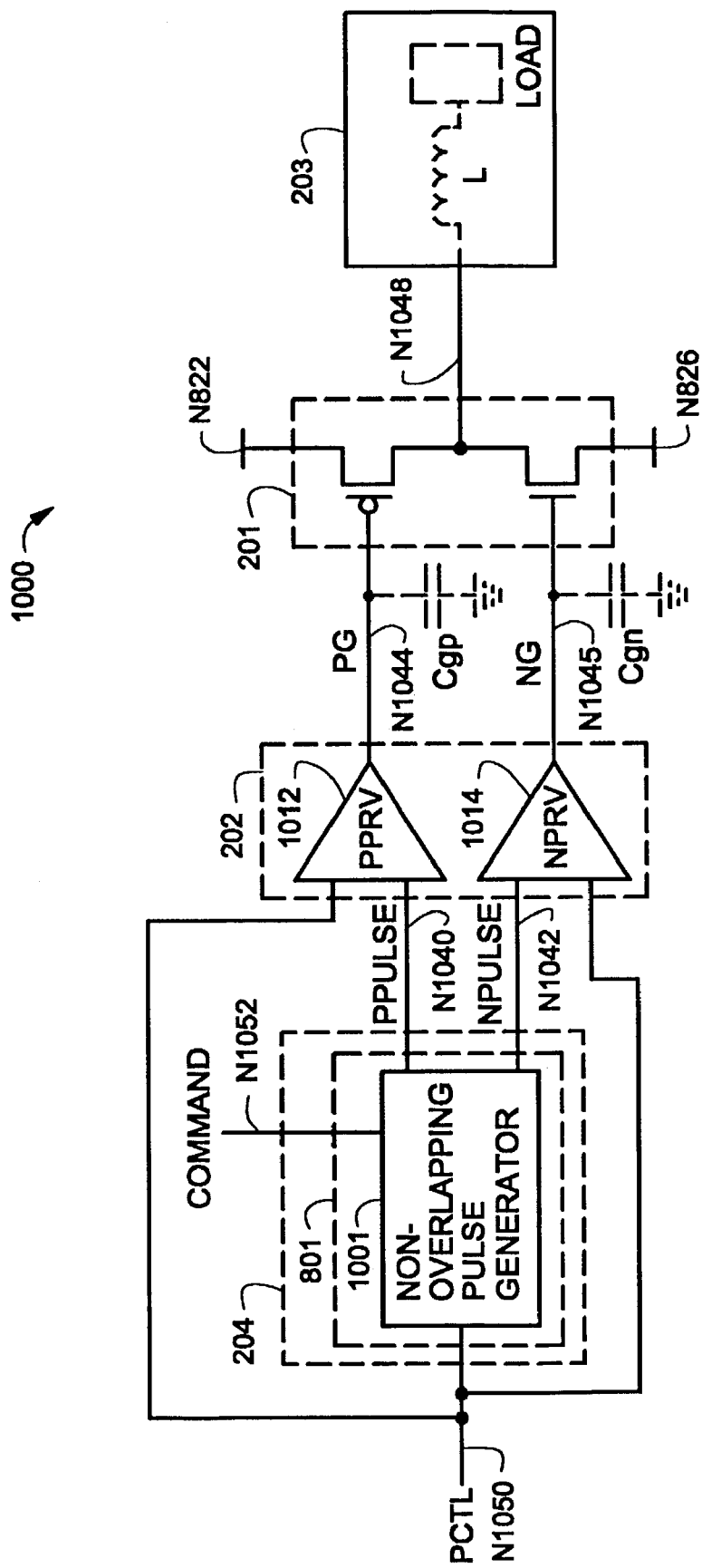
FIG. 10 illustrates a fifth circuit for scaling a power device circuit.

FIG. 10 illustrates a circuit (1000) for scaling a power device. Circuit 1000 includes charge level adjustment circuit 204, power device circuit 201, driver circuit 202, and load circuit 203. Charge level adjustment circuit 204 includes triggered pulse generator 801. Triggered pulse generator 801 includes non-overlapping pulse generator 1001. Driver circuit 202 includes gate driver 1012 and gate driver 1014.

Non-overlapping pulse generator 1001 has a first input that is coupled to node N1050, a second input that is coupled to node N1052, a first output that is coupled to node N1040, a second output that is coupled to node N1042, a third output that is coupled to node N1054, and a fourth output that is coupled to node N1056. Gate driver circuit 1012 has a first input that is coupled to node N1040, a second input that is coupled to node N1054, and an output that is coupled to node N1044. Gate driver circuit 1014 has a first input that is coupled to node N1042, a second input that is coupled to node N1056, and an output that is coupled to node N1045. Power device circuit 201 has a first gate that is coupled to node N1044, a second gate that is coupled to node N1045, and an output that is coupled to node N1048.

In operation, non-overlapping pulse generator 1001 is arranged to generate pulse signal PPULSE at node N1040, pulse signal NPULSE at node N1042, signal PHIP at node N1054 and pulse signal PHIN at node N1056 in response to a pulse control signal (PCTL) that is received from node N1050. Non-overlapping pulse generator 1001 is configured such that the lengths of PPULSE and NPULSE are controlled by COMMAND. Gate driver circuit 1012 is arranged to provide a gate drive signal (PG) at node N1044 in response to pulse signal PPULSE and signal PHIP. Gate driver circuit 1014 is arranged to provide another gate drive signal (NG) at node N1045 in response to pulse signal NPULSE and signal PHIN.

The parasitic capacitances that are associated with node N1044 and N1045 are illustrated in FIG. 10 as capacitors Cgp and Cgn, respectively. Each capacitor is lumped parasitic capacitance that is dominated by the gate capacitance (or capacitances) of the power device circuit (201). Gate driver 1012 is arranged to deliver charge to node N1044 when PPULSE and PHIP are both active, tri-state when PHIP is active and PPULSE is inactive, and discharge node N1044 when PHIP and PPULSE are both inactive. Gate driver 1014 is arranged to deliver charge to node N1045 when NPULSE and PHIN are both active, tri-state when NPULSE is inactive and PHIN is active, and discharge node N1045 when NPULSE and PHIN are both inactive.

Node N822 is coupled to a first power supply (e.g., VDD), while node N826 is coupled to a second power supply (e.g., VSS). An example power device circuit (201) includes a p-type device and an n-type device. The p-type device includes a gate that is coupled to node N1044, a source that is coupled to VDD, and a drain that is coupled to the load. The n-type device includes a gate that is coupled to node N1045, a source that is coupled to VSS, and a drain that is coupled to the load. A voltage that is at least a threshold voltage below VDD activates the p-type device. Thus, the voltage associated with node N1044 is VDD when the p-type device is inactive, and less than VDD when the p-type device is active. A voltage that is at least a threshold voltage above VSS activates the n-type device. Thus, the voltage associated with node N1045 is VSS when the n-type device is inactive, and greater than VSS when the n-type device is active.

Non-overlapping pulse generator 1001 is arranged to provide non-overlapping pulse signals (PPULSE, NPULSE). The non-overlapping pulse signals are arranged such that the NPULSE signal will cause the n-type device (or devices) in the power device circuit (201) to activate only after the p-type devices are fully deactivated. Similarly, the non-overlapping pulse signals are arranged such that the PPULSE signal will cause the p-type device (or devices) in the power device circuit (201) to activate only after the n-type devices are fully deactivated. The non-overlapping operation prevents the simultaneous activation of the p-type and n-type devices.

In one example, the PPULSE signal is generated a delay time after the rising edge of PCTL, and the rising edge of the PHIP signal occurs at approximately the same time delay after the rising edge of PCTL. The delay time may be necessary to permit sufficient time lapse for the discharging of parasitic capacitance Cgn.

In another example, the NPULSE signal is generated a delay time after the falling edge of PCTL, and the rising edge of the PHIN signal occurs at approximately the same time delay after the falling edge of PCTL. The delay time may be necessary to permit sufficient time lapse for the discharging of parasitic capacitance Cgp (which returns to VDD).

Gate drivers 1012 and 1014 generate gate drive signals (PG, NG) in response to PPULSE, NPULSE, PHIP, and PHIN such that the total charge that is accumulated on nodes N1044 and N1045 are limited such that the power device circuit (201) is activated for a specified load condition. At the trailing edge of pulse control signal PPULSE, node N1044 is left essentially floating, such that no appreciable charge is lost from node N1044, and power device circuit 201 will continue driving the load. Similarly, at the trailing edge of pulse control signal NPULSE, node N1045 is left essentially floating, such that no appreciable charge is lose from node N1045, and power device circuit 201 will continue driving the load.

Figure 11:
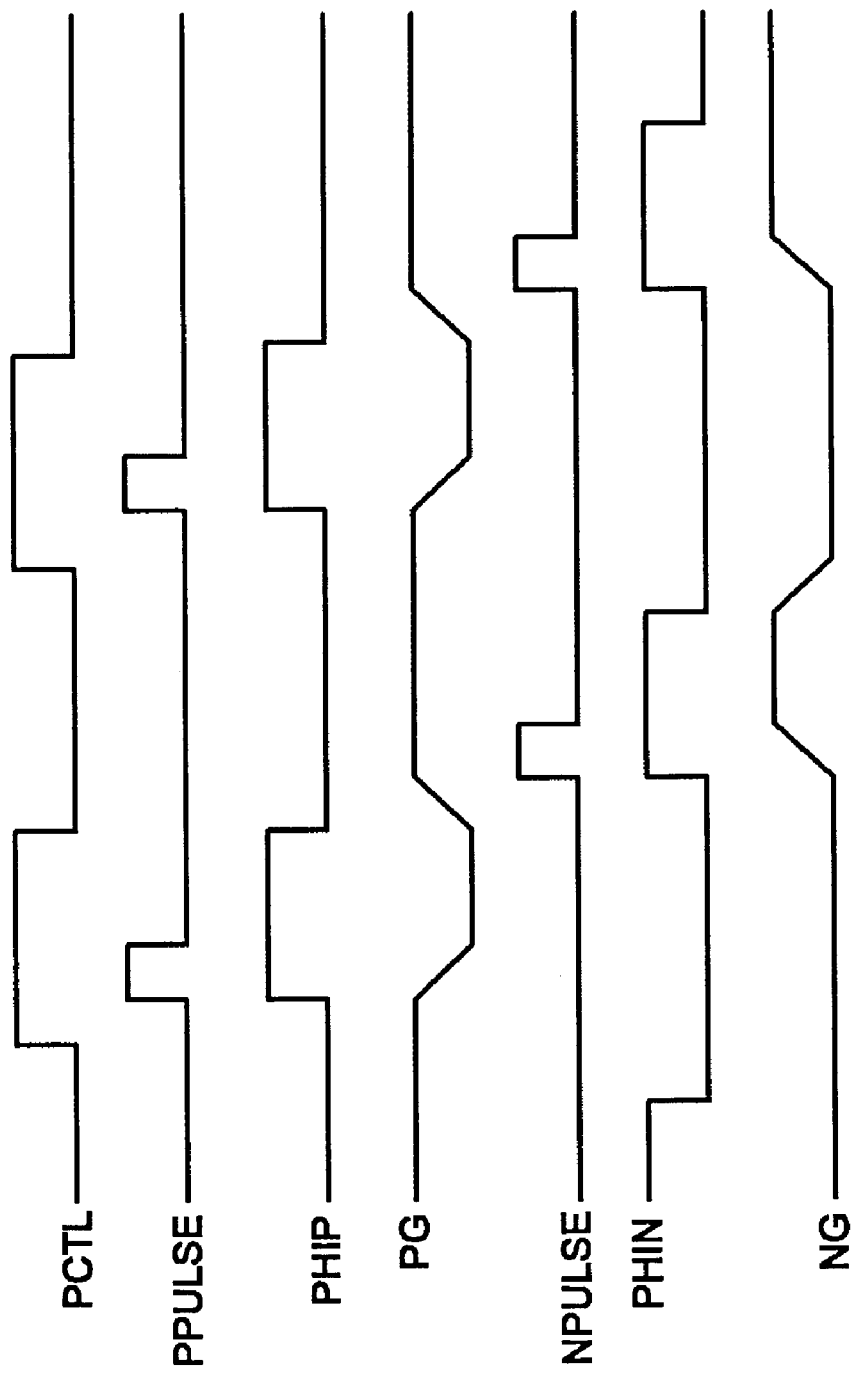
FIG. 11 illustrates an exemplary timing diagram for the circuit shown in FIG. 10.

Timing signals for circuit 1000 are illustrated in FIG. 11, as will be described below.

In response to a rising edge of PCTL, PPULSE is generated and PHIP transition to an active level. The charging cycle for parasitic capacitance Cgp begins when PPULSE and PHIP are both active. Parasitic capacitance Cgp charges (in this case down from VDD) until PPULSE returns to inactive. During the time interval between PPULSE returning to inactive and PHIP remaining active, the PG signal remains charged since node N1044 is essentially floating. On the trailing edge of PCTL, PHIP transitions to an inactive level and parasitic capacitance Cgp is discharged back to VDD.

In response to the falling edge of PCTL, NPULSE is generated and PHIN transitions to an active level. The charging cycle for parasitic capacitance Cgn begins when NPULSE and PHIN are both active. Parasitic capacitance Cgn charges (in this case up from VSS) until NPULSE returns to inactive. During the time interval between NPULSE returning to inactive and PHIN remaining active, the NG signal remains charged since node N1045 is essentially floating. On the rising edge of PCTL, PHIN transitions to an inactive level and parasitic capacitance Cgn is discharged back to VSS.

FIG. 10 shows an example in which the top-side FET is a p-channel FET, and the bottom-side FET is an n-channel FET. In an alternative example, both the top-side FET and the bottom-side FET are n-channel FETs.

The above specification, examples and data provide a complete description of the manufacture and use of the composition of the invention. Since many embodiments of the invention can be made without departing from the spirit and scope of the invention, the invention resides in the claims hereinafter appended.

I claim:

1. A method of scaling a power device circuit by adjusting a charge level of a gate capacitance of the power device circuit comprising:
   initializing a load-optimized charge level;
   evaluating a pulse control signal when the pulse control signal transitions from one of a first logical level and a second logical level to the other, wherein the first logical level is an inverse of the second logical level;
   delivering charge to the gate capacitance of the power device circuit when a first condition and a second condition are satisfied, wherein the first condition is satisfied when a level of the pulse control signal corresponds to the first logical level, and the second condition is satisfied when the charge associated with the gate capacitance of the power device circuit is less than the load-optimized charge level; and
   removing charge from the gate capacitance of the power device circuit when the level of the pulse control signal corresponds to the second logical level.

2. The method as in claim 1, wherein initializing the load-optimized charge level comprises:
   initializing a reference voltage;
   evaluating whether a sensed voltage is less than the reference voltage, wherein the sensed voltage is related to a local supply voltage of a driver circuit, wherein the driver circuit is configured to drive the power device circuit;
   increasing the local supply voltage of the driver circuit when the sensed voltage is less than the reference voltage; and
   decreasing the local supply voltage of the driver circuit when the sensed voltage is greater than the reference voltage.

3. The method as in claim 1 further comprising tri-stating a driver circuit when the charge associated with the gate capacitance of the power device circuit is less than the load-optimized charge level, wherein the driver circuit is arranged to selectively drive the power device circuit.

4. The method as in claim 3, wherein tri-stating the driver circuit further comprises:
   evaluating whether a sensed gate voltage is greater than a reference voltage, wherein the sensed gate voltage is related to a voltage that is associated with the gate of the power device circuit; and
   tri-stating the driver circuit when the sensed gate voltage is not less than the reference voltage.

5. The method as in claim 3, wherein initializing a load-optimized charge level further comprises initializing a reference parameter that corresponds to a pulse width that is associated with a timing pulse.

6. The method as in claim 5 wherein delivering charge to the gate capacitance of the power device circuit further comprises:
   activating the timing pulse in response to the pulse control signal when the pulse control signal transitions to the first logical level, wherein the timing pulse is active for a time duration corresponding to the pulse width;
   evaluating the timing pulse; and
   delivering charge to the gate of the power device circuit when the timing pulse is active.

7. The method as in claim 6, wherein tri-stating the driver circuit further comprises tri-stating the driver device when the timing pulse is inactive.

8. The method as in claim 7, wherein the power device circuit comprises a FET.

9. An apparatus for scaling a power device circuit, wherein the power device circuit is configured to drive a load circuit when the apparatus is active, comprising:
- a driver circuit that includes an output that is coupled to the power device circuit, and a first input that is configured to receive a pulse control signal, wherein the driver circuit is arranged to deliver a charge to a gate capacitance that is associated with the power device circuit when the driver circuit is active; and
- a charge level adjustment circuit that includes an output that is coupled to a second input of the driver circuit, and a first input that is arranged to receive a command control signal, wherein the amount of charge that is delivered to the gate capacitance is adjusted by the command control signal when the apparatus is active such that a voltage associated with the delivered charge corresponds to a drive voltage for the power device circuit, and wherein the drive voltage is in range of a local power supply that is associated with the driver circuit such that the power device circuit is activated by an amount that is approximately optimized for the load circuit.

10. The apparatus as in claim 9, wherein the charge level adjustment circuit comprises a regulator circuit, wherein the regulator circuit includes an output that is coupled to a local supply voltage of the driver circuit, wherein the regulator circuit is arranged to linearly preregulate the local supply voltage of the driver circuit in response to the command control signal.

11. The apparatus as in claim 10, wherein the driver circuit is configured to be selectively activated and deactivated in response to the pulse control signal.

12. The apparatus as in claim 9, wherein the charge level adjustment circuit is further configured to tri-state the driver circuit in response to the command control signal.

13. The apparatus as in claim 9, wherein the charge level adjustment circuit is further configured to tri-state the driver circuit when a feedback voltage exceeds a reference voltage, wherein the feedback voltage is associated with the gate of the power device circuit.

14. The apparatus as in claim 9, wherein the charge level adjustment circuit further comprises a triggered pulse generator, and the driver circuit is further configured to tri-state in response to an output of the triggered pulse generator.

15. The apparatus as in claim 9, wherein the charge level adjustment circuit further comprises a triggered pulse generator that is arranged to provide a pulse signal to the driver circuit, wherein the triggered pulse generator is further configured to adjust a pulse width of the pulse signal in response to the command control signal, such that driver circuit delivers charge to the gate capacitance while the pulse signal and the pulse control signal are active, the driver circuit is tri-stated when the pulse signal is inactive and the pulse control signal is active, and the driver circuit discharges when the pulse control signal is inactive, such that the amount of charge delivered to the gate capacitance is controlled by the pulse width of the pulse signal.

16. The apparatus as in claim 9, wherein the power device circuit comprises a first FET and a second FET, the driver circuit comprises a first gate driver circuit and a second gate driver circuit, and the charge level adjustment circuit comprises a non-overlapping pulse generator, wherein the non-overlapping pulse generator has an output that is coupled to a first input of the first gate driver circuit, another output that is coupled to a first input of the second gate driver circuit, and an input that is coupled to receive the pulse control signal, the first gate driver circuit has an output that is coupled to a gate of the second FET, and the second gate driver circuit has an output that is coupled to a gate of the first FET, wherein the non-overlapping pulse generator is arranged to produce a first timing pulse and a second timing pulse in response to the pulse control signal, wherein the first timing pulse and the second timing pulse are non-overlapping, and the first gate driver circuit is configured to begin charging a gate of the second FET when the first timing pulse activates, float the gate of the second FET when the first timing pulse deactivates, discharge the gate of the second FET in response to the trailing edge of the pulse control signal, and the second gate driver circuit is configured to begin charging a gate of the first FET when the second timing pulse activates, float the gate of the first FET when the second timing pulse deactivates, and discharge the gate of the first FET in response to the rising edge of the pulse control signal, such that the first FET and the second FET are not both active at the same time.

17. An apparatus for scaling a power device circuit by adjusting a charge level of a gate capacitance of the power device circuit comprising:
- means for initializing a load-optimized charge level;
- means for evaluating a pulse control signal when the pulse control signal transitions from one of a first logical level and a second logical level to the other, wherein the first logical level is an inverse of the second logical level;
- means for delivering charge to the gate capacitance of the power device circuit when a first condition and a second condition are satisfied, wherein the first condition is satisfied when a level of the pulse control signal corresponds to the first logical level, and the second condition is satisfied when the charge associated with the gate capacitance of the power device circuit is less than the load-optimized charge level; and
- means for removing charge from the gate capacitance of the power device circuit when the level of the pulse control signal corresponds to the second logical level.

18. The apparatus as in claim 17, wherein the power device circuit comprises a first FET and a second FET, and means for delivering charge to the gate capacitance of the power device circuit comprises means for delivering charge to a gate capacitance of the first FET and delivering charge to a gate capacitance of the second FET such that the first FET and the second FET are not both active at the same time.

* * * * *

UNITED STATES PATENT AND TRADEMARK OFFICE
CERTIFICATE OF CORRECTION

| | | |
|---|---|---|
| PATENT NO. | : 7,000,128 B1 | Page 1 of 1 |
| APPLICATION NO. | : 10/334691 | |
| DATED | : February 14, 2006 | |
| INVENTOR(S) | : Michael Eugene Broach | |

It is certified that error appears in the above-identified patent and that said Letters Patent is hereby corrected as shown below:

In the Application:

First Page Col. 2 (Attorney), Item [74], Line 1, Delete "PC;" and insert -- P.C.;--.

Column 2, Line 54 (Approx.), Delete "EMBODIMENT" and insert

-- EMBODIMENTS --.

Column 6, Line 34, Delete "preregulating" and insert -- pre-regulating--.

Signed and Sealed this

Twenty-second Day of August, 2006

JON W. DUDAS
*Director of the United States Patent and Trademark Office*